United States Patent
Fan et al.

(10) Patent No.: US 7,221,044 B2
(45) Date of Patent: May 22, 2007

(54) HETEROGENEOUS INTEGRATED HIGH VOLTAGE DC/AC LIGHT EMITTER

(75) Inventors: Zhaoyang Fan, Manhattan, KS (US); Hongxing Jiang, Manhattan, KS (US); Jingyu Lin, Manhattan, KS (US)

(73) Assignee: AC LED Lighting, L.L.C., Manhattan, KS (US)

( * ) Notice: Subject to any disclaimer, the term of this patent is extended or adjusted under 35 U.S.C. 154(b) by 224 days.

(21) Appl. No.: 11/040,445

(22) Filed: Jan. 21, 2005

(65) Prior Publication Data

US 2006/0163589 A1    Jul. 27, 2006

(51) Int. Cl.
    H01L 23/495    (2006.01)
(52) U.S. Cl. ................ 257/676; 257/99; 257/778; 257/E25.032; 257/E51.022; 257/E21.511; 368/83; 368/241
(58) Field of Classification Search .............. None
    See application file for complete search history.

(56) References Cited

U.S. PATENT DOCUMENTS

| | | | |
|---|---|---|---|
| 3,900,863 A | 8/1975 | Kim | |
| 5,278,432 A | 1/1994 | Ignatius et al. | |
| 5,317,170 A | 5/1994 | Paoli | |
| 5,563,422 A | 10/1996 | Nakamura et al. | |
| 5,652,434 A | 7/1997 | Nakamura et al. | |
| 5,699,073 A * | 12/1997 | Lebby et al. | 345/82 |
| 5,767,581 A | 6/1998 | Nakamura et al. | |
| 5,773,130 A | 6/1998 | So et al. | |
| 5,877,558 A | 3/1999 | Nakamura et al. | |
| 5,952,680 A | 9/1999 | Strite | |
| 5,955,748 A | 9/1999 | Nakamura et al. | |
| 5,966,393 A | 10/1999 | Hide et al. | |
| 6,054,724 A | 4/2000 | Ogihara et al. | |
| 6,093,965 A | 7/2000 | Nakamura et al. | |
| 6,198,405 B1 | 3/2001 | Andersson et al. | |
| 6,410,940 B1 | 6/2002 | Jiang et al. | |
| 6,461,019 B1 | 10/2002 | Allen | |
| 6,547,249 B2 | 4/2003 | Collins et al. | |
| 6,936,855 B1 * | 8/2005 | Harrah | 257/88 |
| 6,957,899 B2 | 10/2005 | Jiang et al. | |
| 2002/0006040 A1 | 1/2002 | Kameda et al. | |
| 2002/0043943 A1 | 4/2002 | Menzer et al. | |
| 2004/0080941 A1 | 4/2004 | Jiang | |
| 2005/0185401 A1 | 8/2005 | Jiang et al. | |
| 2005/0253151 A1 | 11/2005 | Sakal et al. | |
| 2005/0254243 A1 | 11/2005 | Jiang et al. | |
| 2006/0180818 A1 * | 8/2006 | Nagai et al. | 257/89 |

FOREIGN PATENT DOCUMENTS

JP    P2004-6582 A    1/2004

OTHER PUBLICATIONS

Dr. Jing Li, "III-Nitridge Integrated Photonic Devices", pp. 1-5.
World Standards, "Electricity Around the World", pp. 1-32.
S X Jin, J Li, J Y Lin and H X Jiang, InGaN/GaN Quantum Well Interconnected Microdisk Light Emitting Diodes; Applied Physics Letters, vol. 77, No. 20, p. 3236-3238, Nov. 13, 2000.
Mair et al., Optical properties of GaN/AlGaN multiple quantum well microdisks, Nov. 17, 1997, Appl. Phys. Lett. 76 (5) p. 631, American Institute of Physics.

(Continued)

*Primary Examiner*—Leonardo Andujar
*Assistant Examiner*—Scott R. Wilson
(74) *Attorney, Agent, or Firm*—Lathrop & Gage LC

(57) ABSTRACT

A single-chip integrated LED particularly adapted for direct use with a high voltage DC or AC power sources comprises a plurality of electrically isolated LEDs on a generally transparent substrate and bonded to electrically conductive elements on a thermally conductive mount. A reflective coating may be applied to the area between LEDs.

47 Claims, 3 Drawing Sheets

OTHER PUBLICATIONS

Jiang and Lin; Advances in iii-Nitride Micro-size light Emitters; Advanced Semiconductor Magazine: vol. 14, No. 5.

Chen, Chang, Chen, Fann, Jiang, and Lin; Mechanism of Photoluminescence in GaN/AI (0.2)Ga(0.8)N Superlattices; Applied Physics Letters, vol. 79, No. 23; Dec. 3, 2001.

Jiang and Lin; On Display; OE Magazine Jul. 2001.

Kansas Researchers Fabricate Blue Micro Light-Emitting Diodes, Paving Way for Microdisplays, Energy Saving Lighting; Ascribe The Public Interest Newswire, Sep. 27, 2001.

Zhaoyang Fan, Hongxing Jiang, Jingyu Lin; Related and Copending U.S. Appl. No. 11/144,982, filed Jun. 3, 2005.

Zhaoyang Fan; Related and Copending U.S. Appl. No. 11/340,296, filed Jan. 26, 2006.

C. W Jeon, H.W. Choi and M.D. Dawson; A Novel Fabrication Method For A 64+64 Matrix-Addressable GaN-Based Micro-LED Array; Phys. Stat. Sol. (a) No. 1, 78-82, 2003.

* cited by examiner

HETEROGENEOUS INTEGRATED HIGH VOLTAGE DC/AC LIGHT EMITTER

The U.S. Government has a paid-up license in this invention and the right in limited circumstances to require the patent owner to license others on reasonable terms as provided for by the terms of Contract No. N00014-02-C-0214 awarded by the Office of Naval Research.

BACKGROUND OF THE INVENTION

The present invention relates to a light emitting device, and more particularly, to a heterogeneously integrated light emitting device which may be directly powered by a high DC voltage or by an AC voltage for general lighting, indication or display purposes.

The advances in III-Nitride semiconductors (including GaN, InN, AlN and their alloys) based light emitting diodes ("LEDs") is dramatically changing the lighting technology with a new lighting paradigm. LEDs, which have been until recently mainly used as simple indicator lamps in electronics and toys, now have the great potential to replace incandescent light bulbs in many applications, particularly those requiring durability, compactness, and/or directionality (e.g., traffic, automotive, display, and architectural lighting). Compared with the conventional lighting, semiconductor LED based solid state lighting ("SSL") has the benefits of being more energy efficient with less power consumption, having a longer operational life with reduced maintenance costs, being vibration-resistant, having a vivid saturation color, and the added benefit of a flexible lighting design. It has been estimated that by the year 2025 the electricity saved in the United States by using solid state lighting would be approximately 525 trillion watt hours per year, or $35 billion a year. Additionally, the human visual experience would be enhanced by independently tuning the light intensity and colors of the LEDs.

The conventional LED, depending on the semiconductor materials, operates at a very low DC voltage (roughly between 1V and 5V) and a limited current (~20 mA) with very low luminance, only suitable for indication purposes. To achieve a high luminance for general lighting applications, two methods have been adopted. In the first method the LED still operates at a low DC voltage, but with a very high DC current (<100 mA) to achieve a high luminance. The so-called power LED requires a bulky voltage transformer, an electronics controller and driver to power the LED. In a second method many LEDs are integrated on the same chip with a serial interconnection to achieve one light emitting device, which can directly run under a high DC input voltage. Depending on the integrated LED numbers, the operational voltage may be 12V, 24V, 110V, by, 240V, or even higher. Additionally, with two current paths the high voltage light emitting device may also operate directly at 110/120V or 220/240V AC. This highly integrated high voltage LED device has a size of between hundreds of microns to tens of millimeters, which is completely different from the disclosure in U.S. Pat. No. 6,787,999, in which many discrete packaged LED lamps are serially soldered on a printed circuit board. Other conventional devices have used serially connected packaged LEDs soldered together on a PCB board to form a bulk LED cluster for high voltage applications.

The concept of an integrated single chip LED device which operates under a high DC and/or AC voltage (high voltage DC/AC LED) unfolds a new paradigm for LED applications in lighting, indication and displays. As one example, the high voltage LED may be directly powered by the 110V power grid without any voltage transformer. If the high voltage LED is packaged with a standard Edison or European screw base, it may be directly screwed into a standard light bulb fixture for indoor or outdoor lighting. FIGS. 1 and 2 illustrate the principle to build such a device by directly integrating many LEDs together on a single chip. As illustrated, an InGaAlN LED is grown on a sapphire substrate or other insulating substrate, for example. A prior art conventional low voltage DC LED is generally indicated by reference numeral 10. LED 10 includes a substrate 12, an n-type semiconductor layer 14, a light emission region 16, and a p-type semiconductor layer 18, a p-contact 20, an n-contact 22, and a current spreading layer 24. As illustrated in FIG. 2, a prior art integrated high voltage LED device is generally indicated by reference numeral 26. A number of LEDs serially connect by connecting the p-layer 18 of one LED 10 with the n-layer 14 of the adjacent LED with an interconnection metal layer 28. The integrated LED 26 has two terminals 30 and 32 for connection to an input voltage. Light 34 is extracted from the semiconductor epilayer 18 through the semi-transparent current spreading layer 24.

Several problems with prior art integrated LEDs include inefficient light extraction, thermal dissipation, and low product yield and reliability. Each individual LED 10 has to be isolated from the others by etching through the n-type semiconductor layer 14 to the insulating substrate 12 or to an insulating growth layer (buffer, epilayer, etc.). For InGaAlN-based LEDs, this etching depth is approximately from 2 μm to 6 μm. The deep trenches 36 provide technical challenges for depositing the metal layers 28 to interconnect each LED 10. An inconsistent or thin metal layer 28 may cause leakage or disconnection at the trench side walls 38, which may result in product performance, yield and reliability degradation.

For an InGaAlN based LED device sapphire is the most common substrate and is also the best option for a high voltage LED device because of its high insulation property. If SiC or Si is used as the substrate an insulation buffer layer will be required. Unfortunately, sapphire has a very low thermal conductivity and the limited thermal dissipation degrade the high voltage (and high power) LED device performance and lifetime. Another drawback for the prior art is that the light is extracted from the epilayer device side and a significant portion of the light is blocked and absorbed by the metal layers, including the p-contact 20, n-contact 22, metal layer 28 and the current spreading layer 24 limiting the light emitting efficiency.

SUMMARY OF THE INVENTION

The present invention provides an improved III-nitride semiconductor based high voltage DC/AC light emitting device by heterogeneously integrating an array of LEDs with a passive/active submount through flip-chip bonding or other mounting method. The submount may be aluminum nitride, boron nitride, or other appropriate materials with both insulating and thermal conductivity properties. The submount may include flip-chip bumps for bonding the LED array and enhancing the thermal dissipation and light extraction. The submount may also include passive circuits to serially interconnect the discrete LED array and provide current limiting protection. Furthermore, the submount may also be silicon with an active control circuit on one side and insulating and metal layers to connect the LED array on the other side. The final device has two or more outlet connections for the supplied power (and control signals). The supplied power may be 12V, 24V or other DC voltages, or it may be an AC voltage such as 110/120V or 220/240V. The light emission may be white light, a single color, multiple colors or time-varying color.

DETAILED DESCRIPTION

Figure 1:
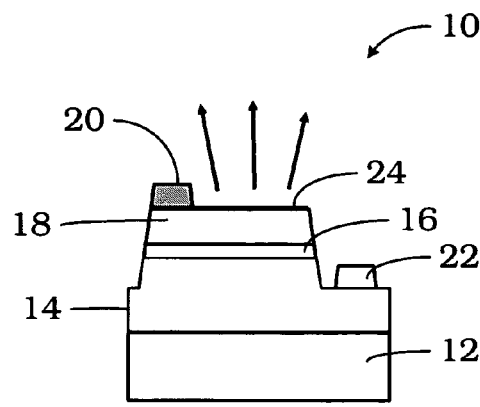
FIG. 1 is a cross sectional view of a prior art LED.
Figure 2:
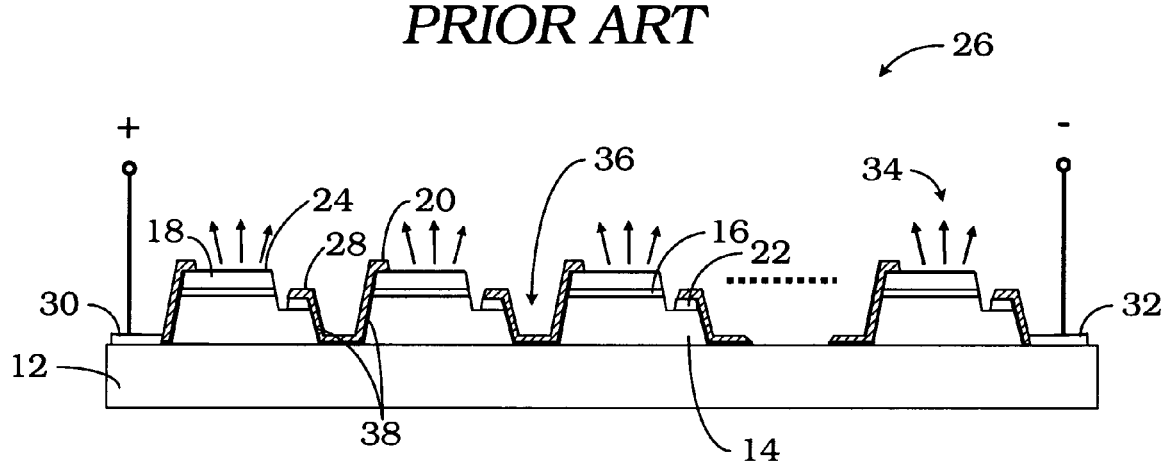
FIG. 2 is a cross sectional view of a prior art LED array.
Figure 3:
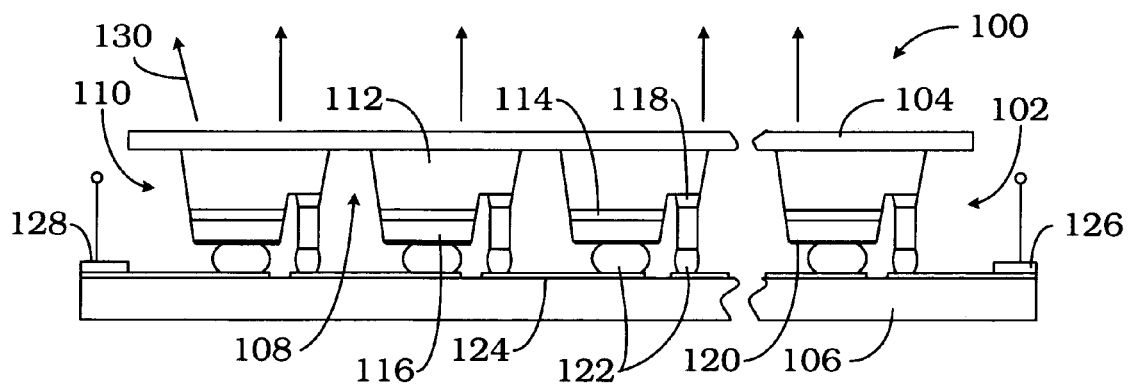
FIG. 3 is a cross sectional view of a flip-chip bonded high voltage light emitting device with the interconnection between each individual LED on the submount.

Referring to FIG. 3, a chip-scale high voltage DC/AC light emitting device is generally indicated by reference numeral 100. The high voltage DC/AC light emitting device 100 is built by heterogeneously integrating a laterally conducting InGaAlN LED array 102 fabricated on a substrate 104 with a submount or mount assembly 106. The array 102 is connected to the submount assembly 106 by flip-chip bonding or other connection method. The substrate 104 may be transparent, semi-transparent, translucent or have similar properties to allow light to be extracted from the substrate. Substrate may be an insulating material such as sapphire ($Al_2O_3$), SiC, Si, GaAs, for example. By flip-chip bonding with the semiconductor epilayers facing down to the submount 106, the light will be extracted from the substrate 104 of the LED array 102. By moving more metal layers from the LED array die to the submount, this invention will also improve the light extraction efficiency. It should be understood that p-n junction, heterojunction, multiple quantum well, organic electro-luminescent, polymer electro-luminescent, ultraviolet (400–300 nm), and deep ultraviolet (300–200 nm) LEDs as well as other types of light emitting diodes may be configured as described hereinabove or in other combinations.

LED array 102 may be fabricated on the substrate 104 using standard integrated chip fabrication techniques. A deep trench 108 is etched between adjacent LEDs 110 down to the substrate 104 to electrically isolate the discrete LEDs 110 from each other. Each LED 110 is generally mesa-shaped with an n-layer 112, a light emitting layer 114, a p-layer 116, an n-contact 118 and a p-contact 120. Interconnection between adjacent LEDs 110 is accomplished using bonding bumps 122 connected to metal layers 124 which are secured to submount 106. Terminals 126 and 128 provide power connection points at each end of LED array 102. Bonding bumps may be solders such as lead/tin (Pb/Sn) or gold/tin (Au/Sn), or metals such as gold (Au) or indium (In), for example.

The LED array 102 performance and life depends on the p-n junction temperature. For a high voltage application, heat dissipation may become more difficult. Failure to adequately dissipate the heat may cause the device performance to suffer and may result in a premature device failure. InGaAlN based semiconductor epilayers grown on a sapphire substrate is ideal for manufacture of a high voltage DC/AC light emitting device because of its insulating properties. However, sapphire has a very low thermal conductivity. To enhance the thermal performance of the light emitting device 100, the LED array 102 is bonded to the submount 106 which may be aluminum nitride, boron nitride or other appropriate materials with a high thermal conductivity and a high electrical resistivity, so that the heat produced at the p-n junction of each LED 110 in array 102 may be easily transferred through the bonding bumps 122 and metal layers 124 to the submount 106 and to the outside package body (not shown).

Figure 7:
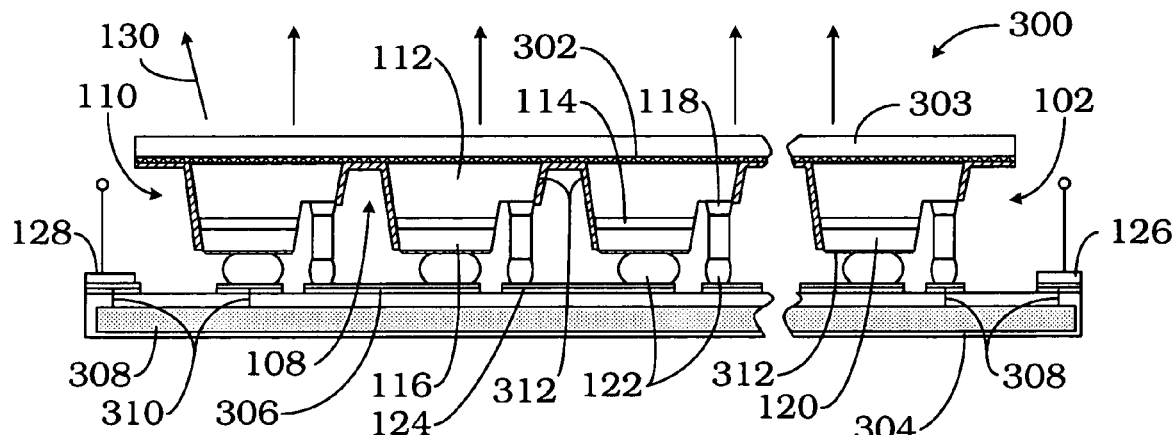
FIG. 7 is a cross sectional view of the device of FIG. 3 with an integrated circuit for protection, control and driving of the LED array.

Light 130 is extracted from the substrate layer 104. The p-contact 120 may be either Ni/Au metal stacks or may incorporate a highly reflective metal layer to reflect light emitted toward the submount 106 back to the substrate layer 104. For example, a thin, transparent Ni/Au metal layer less than 10 nm may be first deposited and annealed to form the ohmic contact to the p-GaN layer, and then a thick layer (greater than 100 nm, for example) of silver or other metal may be deposited on the Ni/Au layer to form a highly reflective mirror. Although not shown in the FIG. 3 embodiment, the reflective features 312 are shown in FIG. 7., in which like features are like numbered. Within the trenches 108 a transparent dielectric/silver stack layer may be deposited as a reflective mirror with the transparent dielectric layer also acting as a passivation layer for the surface of the trench 108. If a reflective metal is not used in the trench area 108 as shown in FIG. 3, a low refractive index dielectric material such as silicon oxide may be used for a surface passivation. But where a reflective metal 312 is used in trenches 108, it will appear as shown in FIG. 7.

Figure 4:
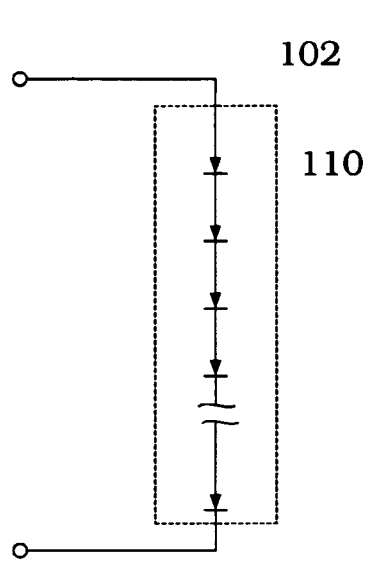
FIG. 4 is a diagrammatic view of a high voltage DC LED.

Referring to FIG. 4, for a DC power input source, the number of serially connected LEDs 110 in array 102 will depend on the input DC voltage. For example, if the operational voltage of each LED 110 is three volts and the input DC voltage is 12 volts, four LEDs 110 may be connected in series across the DC input. To increase the luminance two or more LED arrays 102 may be connected in parallel across the DC input.

Figure 5:
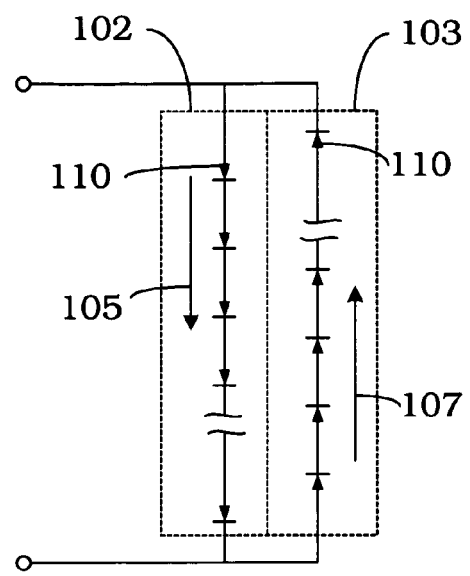
FIG. 5 is a diagrammatic view of a high voltage AC LED.

Referring to FIG. 5, for an AC input power source the number of serially connected LEDs 110 in arrays 102 and 103 will depend on the input AC voltage. For example, if the operational voltage of each LED 110 is three volts and the input AC voltage is 120 volts, 40 LEDs 110 may be connected in series across the AC input for each array 102 and 103. As shown, LED array 102 will be turned on for approximately half of the AC cycle and LED array 103 will be turned on for the other half of the AC cycle. The current flows in direction 105 for array 102 and in direction 107 for array 103. The second array 103 of serially connected LEDs may be connected in parallel in the opposite direction to the first array 102 across the AC input. The arrays of LEDs will be turned alternately on and off 60 times per second for a 60 Hz AC input voltage and 50 times per second for a 50 Hz AC input voltage.

Figure 6:
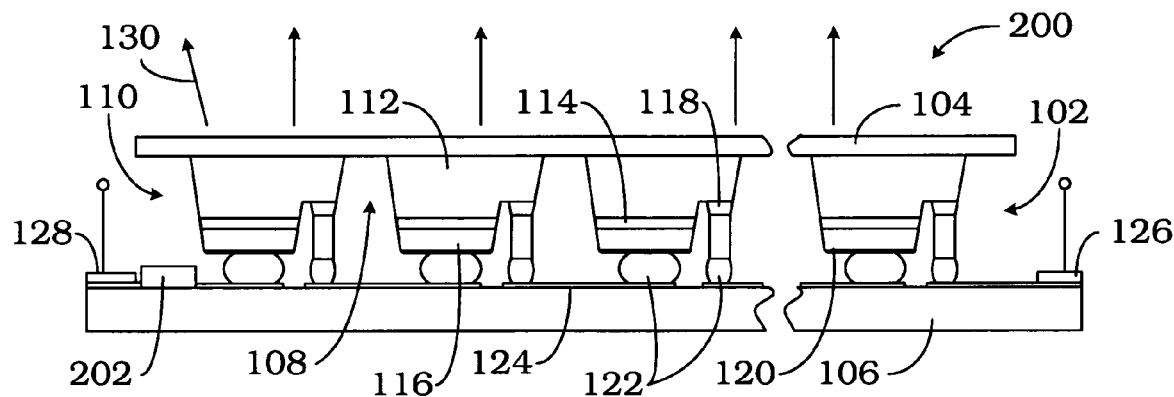
FIG. 6 is a cross sectional view of the device of FIG. 3 with a passive protection circuit.

Referring to FIG. 6, an LED array 102 may be integrated with a passive protecting circuit 202. Since LEDs have a very low dynamic resistance input voltage variations, such as spikes, can overdrive the LED array 102 degrading its performance and reducing its operational life. The integrated passive protecting circuit 202 may be used to reduce or soften voltage variations. Passive protecting circuit 202 may include a current-limiting resistor directly deposited on the submount 106 or may be a surface mounted resistor assembled on the submount. Passive protecting circuit 202 may include a positive temperature coefficient ("PTC") thermistor to protect the LED array 102 from over-current conditions. During normal operating conditions the PTC thermistor remains in a low resistance state resulting in a negligible attenuation in current flow through the device. When an over-current condition occurs the PTC thermistor switches into a high resistance state thereby limiting the current flow through the LED array 102 to a normal operating level. When the high-current condition is removed, the PTC thermistor resets to its low resistance state and permitting a normal operating current to flow through the LED array 102.

Referring to FIG. 7, another embodiment of a chip-scale high voltage DC/AC light emitting device is generally indicated by reference numeral 300. Components similar to those shown in FIG. 5 are indicated by the same reference numeral. High voltage DC/AC light emitting device 300 is built by heterogeneously integrating a laterally conducting InGaAlN LED array 102 fabricated on an electrically insulating layer 302 on a substrate 303 with a submount assembly 304 by flip-chip bonding or other mounting method. Insulating layer 302 may include GaN, AlN, InGaAlN, $Al_2O_3$, Si, or GaAs, for example. Substrate 303 may be made of a thermally conductive or electrically conductive material or an insulating material. Bonding bumps 122 are connected to metal layers 124 which are bonded to thin insulating layers 306. Insulating layers 306 may be silicon oxide or silicon nitride, for example. Submount assembly 304 may be copper, aluminum or silicon, for example, and may include a control and driving circuit 308 to control the LED array 102 through interconnections 310. Reflective layers 312 may be deposited in the trench areas 108 and on the p-contact layer 120 to improve the light extraction efficiency of the device 300.

Figure 8:
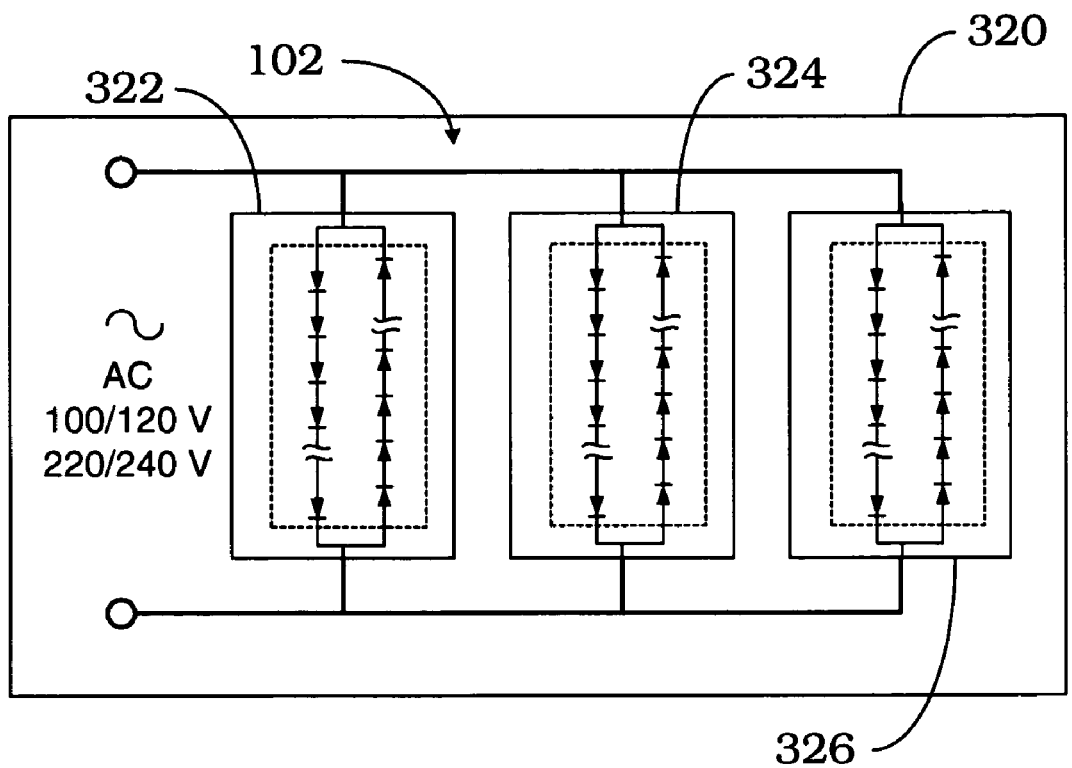
FIG. 8 a diagrammatic view of three integrated single color LED arrays connected in parallel.
Figure 9:
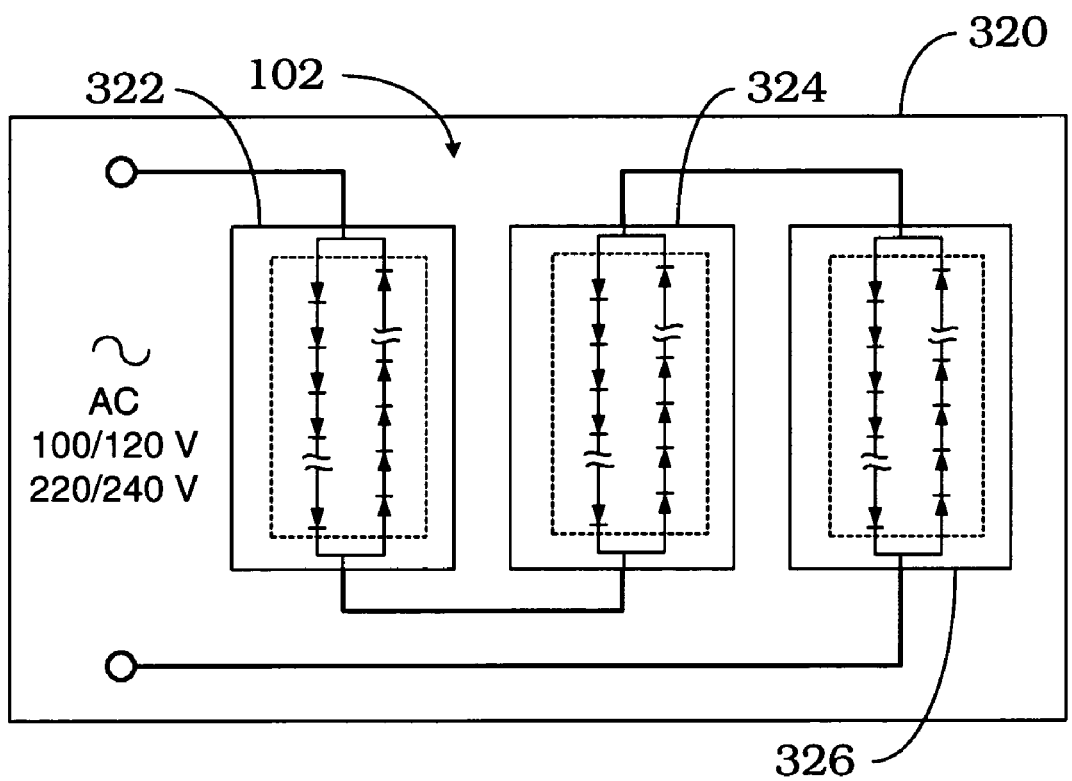
FIG. 9 a diagrammatic view of three integrated single color LED arrays connected in series.

Referring to FIGS. 8 and 9, multiple LED array emitters 102 may be integrated on a single submount 320. Different spectrally distinguishable LED dies 322, 324 and 326, such as blue, green and red, may be connected and controlled by a circuit mounted or integrated on submount 320. LED array emitters 102 may be connected in parallel (FIG. 8) or in series (FIG. 9). To construct a white color DC/AC light emitting device, light from the blue 322, green 324 and red 326 LED dies may be mixed. Each of the LED dies may be independently controlled to achieve a desired luminance and color mix. The mixed light may be balanced to create a white light or a colored light depending on the mixing parameters and control. The integrated controls may produce a time-varying colorful light. When connected in series (FIG. 9), the number of individual LEDs on each of the three spectrally distinguishable emitter dies may be varied to achieve the desired white color or temperature of the white light.

Another method to achieve white light emission from LEDs is to use blue LEDs made of III-nitrides to generate white light and then coating the substrate layer or the inside of the device packaging such as the inside surface of a glass bulb in which the device is mounted, with yellow phosphors. Phosphors down convert part of the shorter wavelength blue light to a yellow wavelength visible yellow light. Through color mixing, the eye sees white when two colors are properly balanced. Another method includes using UV or near UV LEDs to pump three-color phosphors (red, blue, green, RBG) or to combine three color (RBG) LEDs to get a white emission.

It should be understood that while a certain form of this invention has been illustrated and described, it is not limited thereto except insofar as such limitations are included in the following claims.

The invention claimed is:

1. A light source comprising:
   an array of electrically isolated LEDs mounted on a substrate,
   each of said LEDs having a p-contact and an n-contact,
   a mount opposing said substrate, said mount having an array of conductive elements,
   said array of electrically isolated LEDs connected to said array of conductive elements of said mount,
   terminals adapted to connect said array of conductive elements across a power source, and
   said array of conductive elements being arranged to provide an electrical connection between the p-contact of each of said LEDs and the n-contact of an adjacent LED whereby to serially connect each of said LEDs of said array.

2. The light source as set forth in claim 1 wherein said substrate is generally transparent.

3. The light source as set forth in claim 1 wherein said mount is thermally conductive.

4. The light source as set forth in claim 1 wherein said mount is a thermally conductive material selected from the group consisting of aluminum nitride, boron nitride, and silicon.

5. The light source as set forth in claim 1 wherein said mount includes a current limiting device connected between one of said terminals and said array of conductive elements.

6. The light source as set forth in claim 1 wherein said mount includes a control circuit connected between one or more of said terminals and said array of conductive elements.

7. The light source as set forth in claim 1 further comprising a reflective material deposited between said adjacent LEDs.

8. The light source as set forth in claim 1 further comprising a reflective material deposited on said p-contacts.

9. The light source as set forth in claim 1 further comprising an electrically insulating material secured to said mount between said mount and said array of conductive elements.

10. The light source as set forth in claim 1 wherein said LEDs are LEDs selected from the group consisting of semiconductor p-n junctions, semiconductor heterojunctions, semiconductor quantum wells, organic electro-luminescent materials, polymer electro-luminescent materials, ultraviolet, deep ultraviolet, red, green, blue, yellow, and white.

11. The light source as set forth in claim 1 further comprising an electrically insulating material layer between said array of electrically isolated LEDs and said substrate.

12. The light source as set forth in claim 11 wherein said substrate is electrically conductive.

13. The light source as set forth in claim 1 wherein said array of electrically isolated LEDs are flip-chip bonded to said array of conductive elements of said mount.

14. A light source comprising:
   an array of electrically isolated LEDs mounted on a substrate, each of said LEDs having a p-contact and an n-contact,
   a substantially planar mount having an array of conductive elements, said mount opposing said substrate,
   said array of electrically isolated LEDs connected to said conductive elements of said mount, end terminals adapted to connect said array of conductive elements across a power source, and said array of conductive elements being arranged along said mount to provide an electrical connection between the p-contact of each of said LEDs and the n-contact of an adjacent LED to serially connect each of said LEDs of said array and present a direction of current flow whereby to emit light in response to connection across said power source.

15. The light source of claim 14 further comprising:

a second array of electrically isolated LEDs mounted on a second substrate, each LED of said second array having a p-contact and an n-contact, a second array of conductive elements secured to said mount, said second array of electrically isolated LEDs connected to said second array of conductive elements secured to said mount, said second array of conductive elements being arranged to provide an electrical connection between the p-contact of each of said LEDs of said second array and the n-contact of an adjacent LED of said second array to serially connect each of said LEDs of said second array and present a second direction of current flow, said second array of conductive elements connected to said end terminals whereby to emit light in response to connection across said power source.

16. A light source comprising:

a first array of substrate-mounted electrically-isolated LEDs, each of said LEDs having a p-contact and an n-contact, a mount having a first array of conductive elements, said first array of electrically isolated LEDs connected to said first array of conductive elements of said mount, end terminals adapted to connect said first array of conductive elements across a power source, said first array of conductive elements being arranged to provide an electrical connection between the p-contact of each of said LEDs and the n-contact of an adjacent LED to serially connect each of said LEDs of said first array and present a direction of current flow whereby to emit light in response to connection across said power source;

a second array of electrically isolated LEDs, each LED of said second array having a p-contact and an n-contact, a second array of conductive elements secured to said mount, said second array of electrically isolated LEDs connected to said second array of conductive elements secured to said mount, said second array of conductive elements being arranged to provide an electrical connection between the p-contact of each of said LEDs of said second array and the n-contact of an adjacent LED of said second array to serially connect each of said LEDs of said second array and present a second direction of current flow, said second array of conductive elements connected to said end terminals whereby to emit light in response to connection across said power source; and said second array of conductive elements are connected to said end terminals in parallel to said first array of conductive elements.

17. The light source as set forth in claim 16 wherein said second direction of current flow is opposite to said direction of current flow whereby to alternately emit light in response to connection across an AC power source during each half cycle.

18. The light source as set forth in claim 16 wherein said second array of electrically isolated LEDs emit a light that is spectrally distinguishable from the light emitted from said first array of electrically of isolated LEDs.

19. The light source as set forth in claim 16 wherein said LEDs in at least one of said first array and second arrays of LEDs are selected from the group consisting of semiconductor p-n junctions, semiconductor heterojunctions, semiconductor quantum wells, organic electro-luminescent materials, polymer electro-luminescent materials, ultraviolet, deep ultraviolet, red, green, blue, yellow, and white.

20. The light source as set forth in claim 16 further comprising a reflective material deposited in trenches between adjacent LEDs.

21. The light source as set forth in claim 16 wherein said first and second arrays of LEDs are mounted on generally transparent substrates.

22. The light source as set forth in claim 16 wherein said mount includes a current limiting device connected between one of said terminals and one of said first and second arrays of conductive elements.

23. The light source as set forth in claim 16 wherein said mount includes a control circuit connected between one or more of said terminals and one of said first and second arrays of conductive elements.

24. The light source as set forth in claim 16 further comprising an electrically insulating layer between said mount and one of said first and second arrays of conductive elements.

25. The light source as set forth in claim 24 wherein said mount is electrically conductive.

26. The light source as set forth in claim 16 further comprising an electrically insulating material layer between one of said first and second arrays of LEDs and a substrate.

27. The light source as set forth in claim 26 wherein said substrate is electrically conductive.

28. The light source as set forth in claim 16 wherein said first array and second array of electrically isolated LEDs are flip-chip bonded to said first array of conductive elements of said mount.

29. A light source comprising:

a first array of substrate-mounted electrically-isolated LEDs, each of said LEDs in said first array having a p-contact and an n-contact, a mount having a first array of conductive elements, said first array of LEDs connected to said first array of conductive elements of said mount, end terminals adapted to connect said first array of conductive elements across a power source, said first array of conductive elements being arranged to provide an electrical connection between the p-contact of said LEDs in said first array and the n-contact of an adjacent LED in said first array to serially connect each of said LEDs in said first array and present a direction of current flow whereby to emit light in response to connection across said power source;

a second array of electrically isolated LEDs, each LED of said second array having a p-contact and an n-contact, a second array of conductive elements secured to said mount, said second array of electrically isolated LEDs connected to said second array of conductive elements secured to said mount, said second array of conductive elements being arranged to provide an electrical connection between the p-contact of each of said LEDs of said second array and the n-contact of an adjacent LED of said second array to serially connect each of said LEDs of said second array and present a second direction of current flow, said second array of conductive elements connected to said end terminals whereby to emit light in response to connection across said power source; and a reflective material deposited on said p-contacts.

30. A light source comprising:
a first array of substrate-mounted electrically-isolated LEDs, each of said LEDs in said first array having a p-contact and an n-contact, a mount having a first array of conductive elements, said first array of LEDs connected to said conductive elements of said mount, end terminals adapted to connect said first array of conductive elements across a power source, said first array of conductive elements being arranged to provide an electrical connection between the p-contact of each of said LEDs in said first array and the n-contact of an adjacent LED in said first array to serially connect each of said LEDs in said first array and present a direction of current flow whereby to emit light in response to connection across said power source;
a second array of substrate-mounted electrically-isolated LEDs, each LED of said second array having a p-contact and an n-contact, a second array of conductive elements secured to said mount, said second array of electrically isolated LEDs connected to said second array of conductive elements secured to said mount, said second array of conductive elements being arranged to provide an electrical connection between the p-contact of each of said LEDs of said second array and the n-contact of an adjacent LED of said second array to serially connect each of said LEDs of said second array and present a second direction of current flow, said second array of conductive elements connected to said end terminals whereby to emit light in response to connection across said power source; and
said mount is a thermally conductive material selected from the group consisting of aluminum nitride, boron nitride, and silicon.

31. A light source comprising:
a first array of electrically isolated LEDs each having a p-contact and an n-contact, and mounted on a substrate,
a second array of electrically isolated LEDs each having a p-contact and an n-contact, and mounted on said substrate,
a mount having first and a second arrays of conductive elements, end terminals adapted to connect said first and a second arrays of conductive elements across a power source, said first and second arrays of LEDs connected to said first and a second arrays of conductive elements, said first and a second arrays of conductive elements being arranged to provide an electrical connection between the p-contact of each of said LEDs in said first and second arrays and the n-contact of an adjacent LED to serially connect each of said LEDs of each of said first and second arrays, whereby to emit light in response to connection of said end terminals across said power source and wherein said first array of LEDs is connected in parallel to said second array of LEDs in such a way that current flow is in a first direction through said first array and a second direction in said second array.

32. The light source as set forth in claim 31 wherein light emitted from said first array of LEDs is spectrally discernable from said light emitted from said second arrays of LEDs.

33. The light source as set forth in claim 31 further comprising a control circuit for independently controlling each of said arrays of electrically isolated LEDs.

34. The light source as set forth in claim 31 wherein said first direction of current flow is opposite said second direction of current flow.

35. The light source as set forth in claim 31 wherein said power source is 110 volts AC.

36. The light source as set forth in claim 31 wherein said power source is 220 volts AC.

37. The light source as set forth in claim 31 wherein said power source is 12 volts DC.

38. The light source as set forth in claim 31 wherein said substrate is generally transparent.

39. The light source as set forth in claim 31 wherein said LEDs are LEDs selected from the group consisting of semiconductor p-n junctions, semiconductor heterojunctions, semiconductor quantum wells, organic electro-luminescent materials, and polymer electro-luminescent materials, ultraviolet, deep ultraviolet, red, green, blue, yellow, and white.

40. The light source of claim 31 comprising:
a first die including said first and second arrays of LEDs;
a second die which is substantially identical to said first die; and
said first and second dies being connected in series.

41. The light source of claim 40 wherein said first die is adapted to emit light which is spectrally discernable from said light emitted from said second die.

42. The light source of claim 40 comprising:
a third die which is substantially identical to said first and second dies, said third die being in series with said first and second dies.

43. The light source of claim 42 wherein said third die is adapted to emit light which is spectrally discernable from said light emitted from each of said first and second dies.

44. The light source of claim 31 comprising:
a first die including said first and second arrays of LEDs;
a second die which is substantially identical to said first die; and
said first and second dies being connected in parallel.

45. The light source of claim 44 wherein said first die is adapted to emit light which is spectrally discernable from said light emitted from said second die.

46. The light source of claim 45 comprising:
a third die which is substantially identical to said first and second dies, said third die being in parallel with said first and second dies.

47. The light source of claim 46 wherein said third die is adapted to emit light which is spectrally discernable from said light emitted from each of said first and second dies.

* * * * *